United States Patent [19]

Thanh

[11] Patent Number: 4,673,660
[45] Date of Patent: Jun. 16, 1987

[54] CIRCUIT SUBSTRATE

[75] Inventor: Truong D. Thanh, Kawasaki, Japan

[73] Assignee: Kabushiki Kaisha Toshiba, Kawasaki, Japan

[21] Appl. No.: 878,780

[22] Filed: Jun. 26, 1986

[30] Foreign Application Priority Data

Jun. 27, 1985 [JP] Japan .................. 60-138918

[51] Int. Cl.$^4$ .................. C04C 35/46; C04C 35/14
[52] U.S. Cl. .................. 501/135; 501/137; 501/138; 501/139
[58] Field of Search .................. 501/135, 137, 138, 139

[56] References Cited

U.S. PATENT DOCUMENTS 4,106,075  8/1978  Baumann et al. .................. 501/134

FOREIGN PATENT DOCUMENTS 55-10926  3/1980  Japan .................. 252/62.9

OTHER PUBLICATIONS

IMC 1984 Proceedings, Tokyo, May, 1984, pp. 220-223; T. D. Thanh.

Primary Examiner—Mark L. Bell
Attorney, Agent, or Firm—Schwartz, Jeffery, Schwaab, Mack, Blumenthal & Evans

[57] ABSTRACT

A circuit substrate according to the present invention comprises a sintered oxide body used as an insulating body, in which the sintered oxide body contains barium, tin, boron, titanium, silicon, and manganese in accordance with a converted equivalent composition of:

| | |
|---|---|
| BaO | 10 to 55 mol %; |
| $SnO_2$ | 2 to 45 mol %; |
| $B_2O_3$ | 5 to 40 mol %; |
| $TiO_2$ | 0.1 to 25 mol %; |
| $SiO_2$ | 0.5 to 30 mol %; and |
| MnO | 0.5 to 7 mol %. |

An oxide with above composition can be fired at low temperatures on the order of 800° to less than 1300° C., and as a result it is possible to obtain a black circuit substrate that possesses properties of opacity to or absorption of light.

4 Claims, No Drawings

CIRCUIT SUBSTRATE

BACKGROUND OF THE INVENTION

1. Field of the Invention

The present invention relates to a black ceramic circuit substrate that possesses the property of opacity to or absorption of light that is used as a circuit substrate for electronic parts such as IC substrate, circuit substrate, and package for integrated circuit.

2. Description of the Prior Art

As the substrate for a ceramic package of an integrated circuit or an electronic display panel in the solid display unit such as desk calculator and counter, use is generally made of high-alumina porcelain.

However, for the use as the substrate, a black substrate is required for the reason of shielding the light in the former case of ceramic package and for the reason of accuracy of digital display in the latter case of electronic display panel. In addition, there is a necessity, for these substrates, of forming numerous patterns for wiring by means of metalization method. Since, however, the metalized surface is obtained by firing or baking a metalizing of Mo-Mn system or the like in a high temperature reducing atmosphere in the electric oven, the constituents of the substrate will also undergo reduction. This leads necessarily to a deterioration in insulation resistance of the substrate so that it was not possible to use black ceramics for the above purpose.

Now, it is well known that a satisfactory black substrate can be obtained by firing $Al_2O_3$ as the principal constituent, with addition of several % by weight of $SiO_2$, $MgO$, $CaO$, $TiO_2$, and $Cr_2O_3$, in a reducing atmosphere.

However, when use is made of alumina, the firing temperature is high in the range of 1500° to 1600° C. so that there was a restriction on the conducting materials that may be utilized. For example, in the case of multilayered circuit substrate in which simultaneous sintering is applied to the conducting paste and the substrate, it was necessary to use a conducting paste based on tungsten (W), molybdenum (Mo), and the like that can withstand sufficiently strongly the firing temperature for alumina. However, W and Mo have resistivity of $5.2 \times 10^{-6} \Omega.cm$ and $5.5 \times 10^{-6} \Omega.cm$, respectively, that are about three times as large the value of $1.6 \times 10^{-6} \Omega.cm$ for Silver (Ag). Accordingly, in order to obtain a conducting line with equal conductivity, it is necessary to make the width of the conducting line to be about three times as large, so that it leads to a drawback that high density wirings cannot be realized.

Moreover, to raise the firing temperature to a high value, the output of the electric oven has to be raised, so that it puts a burden on the electric oven and hence leads to a further drawback of reduction in the life of the electric oven.

Furthermore, there is a disadvantage that satisfactory insulation characteristics may not be obtained unless there is given a strict adjustment on the oxygen partial pressure in the reducing atmosphere.

Still further, although reduction in the firing temperature has been attempted by the addition of glass component, in the case of multilayered wiring, there is generated, due to narrowing of the separation between the wirings, a migration of atoms of metallic conductor in the glass layer so that there is a fear of deteriorating insulation characteristics of the glass layer.

To eliminate these drawbacks there has been desired a development of circuit substrates which enable firing at low temperatures without deteriorating such characteristics as insulation property.

SUMMARY OF THE INVENTION

An object of the present invention is to provide a circuit substrate which enables a high density wiring at low temperature of firing.

Another object of the present invention is to provide a circuit substrate which makes it possible to carry out firing in the air.

Another object of the present invention is to provide a circuit substrate in which no migration is generated even in the case of multilayered wiring because of non-inclusion of glass component.

One aspect of the present invention is that the sintered oxide body to be used as an insulation member for a black circuit substrate, includes barium, tin, boron, titanium, silicon, and manganese whose equivalent composition can be converted as shown below.

| | |
|---|---|
| BaO | 10 to 55 mol % |
| $SnO_2$ | 2 to 45 mol % |
| $B_2O_3$ | 5 to 40 mol % |
| $TiO_2$ | 0.1 to 25 mol % |
| $SiO_2$ | 0.5 to 30 mol % |
| MnO | 0.5 to 7 mol % |

DETAILED DESCRIPTION OF THE INVENTION

A first mode of sintered oxide body in accordance with the present invention which is used as an insulation body for a black circuit substrate, includes barium, tin, boron, titanium, silicon, and manganese that may be converted to an equivalent composition as shown below.

| | |
|---|---|
| BaO | 10 to 55 mol % |
| $SnO_2$ | 2 to 45 mol % |
| $B_2O_3$ | 5 to 40 mol % |
| $TiO_2$ | 0.1 to 25 mol % |
| $SiO_2$ | 0.5 to 30 mol % |
| MnO | 0.5 to 7 mol % |

By choosing such a composition it becomes possible to obtain a black circuit substrate that can be fired at a low sintering temperature of below 1300° C. This substrate has a small coefficient of thermal expansion $\alpha$ of less than $8 \times 10^{-6}/°C$. which is comparable to that of Si (namely, $4 \times 10^{-6}/°C$.), and hence, is ideal for the hybrid substrate on which an LSI chip may be mounted directly. Moreover, it possesses other characteristics that are satisfactory for use as a circuit substrate such as a specific dielectric constant of less than 12, a dielectric loss tan $\delta$ of the order of $8 \times 10^{-3}$, and an insulation resistance $\rho$ of above $3 \times 10^{+12} \Omega.cm$. It further possesses a satisfactory flexural strength of more than 1300 $kg/cm^2$.

In the present invention, the amount of the components of the sintered oxide body are limited according to the reasons that will be described below.

First, regarding $SnO_2$, it possesses basically the properties of a semiconductor so that if an excessive amount is used, the insulation resistance of the product will be reduced and the satisfactory characteristics as an insulating substrate will be lost. Further, the dielectric loss (tan δ) and the specific dielectric constant (εs) will be increased so that high wiring density property and high frequency characteristics will become deteriorated.

On the other hand, if the amount of $SnO_2$ is insufficient, the coefficient of thermal expansion will be increased so that when, for example, an LSI chip is mounted on it, the chip becomes easily warped or bent. For these reasons, an amount of Sn which is in the range of 2 to 45 mol % when it is converted to $SnO_2$ will be preferred.

As to BaO, if it is used in excess, the product becomes fragile and the substrate will have an inferior strength. On the other hand, if the amount is insufficient, the coefficient of thermal expension α will become large. In particular, if boron is abundant in a region where barium is scarce, the increase in the coefficient of thermal expansion α is conspicuous, whereas, if the amount of boron is insufficient, then the deterioration in tan δ will become conspicuous. Therefore, the amount of Ba in the range of 10 to 55 mol % when converted to BaO is preferred.

Next, when the amount of boron in the form of $B_2O_3$ is insufficient, the effects of firing at low temperature which represent the principal object of the present invention may not be attained, necessitating a firing temperature on the order of above 1300° C. When it is in excess, however, there will result an increase in the coefficient of thermal expansion α.

Hence, an amount of boron in the range of 5 to 40 mol % when converted to $B_2O_3$ is preferred.

It is possible to obtain a circuit substrate that possesses sufficiently superior characteristics of various kinds and permits a firing at a low temperature of below 1300° C., at a temperature of even with a system consisting of BaO, $SnO_2$, and $B_2O_3$ that has a composition, for instance, of 10 to 68 mol % of BaO, 9 to 50 mol % of $SnO_2$, and 13 to 72 mol % of $B_2O_3$. However, by an addition of MnO as in the present invention, it became possible to further lower the firng temperature and to obtain blackening of the substrate. However, if the amount of MnO is insufficient, the blackening is insufficient, and if it is in excess, the resistivity is reduced and the dielectric loss tan δ is deteriorated.

Therefore, an amount of managanese in the range of 0.5 to 7 mol % when converted to MnO is preferred.

By further inclusion of $TiO_2$ and $SiO_2$, the resistance of the substrate to the environmental conditions can be increased markedly.

Now, considering the case of using a substrate under general environmental conditions, one cannot afford to ignore the influence of the humidity.

By the inclusion of $TiO_2$ and $SiO_2$ the resistance to humidity can be improved by the synergetic effect of both of these components.

If the amounts of Ti and Si are less than 0.1 mol % and 0.5 mol % when they are converted to $TiO_2$ and $SiO_2$, respectively, the coefficient of water absorption becomes large such that when the substrate is used in an enviroment in which humidity is high or there is water present, there will arise a possibility of having the insulation resistance reduced.

Regarding $TiO_2$, if it exceeds 25 mol %, there will be generated a deterioration in other characteristics such as specific dielectric constant.

Therefore, an amount of titanium in the range of 0.1 to 25 mol % when converted to $TiO_2$ is preferred.

Furthermore, if the amount of $SiO_2$ exceeds 30 mol %, the amount of the glass component in the substrate is increased, which leads to such a problem as migration.

Hence, an amount of silicon in the range of 0.5 to 30 mol % when converted to $SiO_2$ is preferred.

As in the foregoing, according to the present invention, it is possible to obtain a black insulation substrate with a firing temperature of less than 1300° C. that possesses the property of opacity to or absorption of light. Since it can be made possible to utilize low-temperature firing pastes with low sheet resistance such as Cu paste or Ag-based pastes like Ag, Ag-Pb, Ag-Pt, and others, in place of W or Mo in the case of $Al_2O_3$, the use of a substrate according to the present invention will become very effective, permitting to realize high density wiring. Further, the effect of reduction in the energy cost for manufacture will be made large by the lowering of the firing temperature. Although low-temperature firing is known to be possible by an exclusive combination of BaO, $SnO_2$, and $B_2O_3$, the amount of the binder needed in making a sheet can be reduced, factor of contraction during sintering can be made small, and the design and manufacture of the substrate can be facilitated by the addition of MnO, $SiO_2$, and $TiO_2$.

In the present invention, the sintered body is considered to consists basically of $BaSn(BO_3)_2$, with coexisting structures in which the various sites in this compound are replaced by Ti, Si, Mn, or others, and other compound oxides.

In particular, the ranges of the composition of the components given by

| | |
|---|---|
| BaO | 15 to 40 mol % |
| $SnO_2$ | 10 to 34 mol % |
| $B_2O_3$ | 20 to 40 mol % |
| $TiO_2$ | 1 to 15 mol % |
| $SiO_2$ | 2 to 20 mol % |
| MnO | 0.5 to 6 mol % | are very effective since they lead to the manufacture of a black substrate that has an excellent characteristic of $α ≦ 6.5 × 10^{-6}/°C$. and permits a low-temperature sintering, at a firing temperature of less than about 1100° C.

In addition, the ranges of composition of

| | |
|---|---|
| BaO | 20 to 35 mol % |
| $SnO_2$ | 15 to 32 mol % |
| $B_2O_3$ | 20 to 35 mol % |
| $TiO_2$ | 2 to 10 mol % |
| $SiO_2$ | 3.5 to 15 mol % |
| MnO | 1 to 5 mol % | represents particularly preferred ranges since the substrate obtained posesses an excellent water-proof characteristic in which the coefficient of water absorption is about 1/30 of that of the glass epoxy substrate, even after the elapse of 100 hours of pressure cooker test (PCT).

Further, when the ranges of composition are limited to

| | |
|---|---|
| BaO | 25 to 35 mol % |
| $SnO_2$ | 23 to 32 mol % |
| $B_2O_3$ | 20 to 30 mol % |
| $TiO_2$ | 2 to 7 mol % |
| $SiO_2$ | 4 to 12 mol % |

| -continued | |
|---|---|
| MnO | 1 to 3 mol % | it becomes possible to manufacture a substrate at a firing temperature of less then about 1050° C. The substrate obtained has a coefficient of thermal expansion of less than $\alpha = 5 \times 10^{-6}/°C$. which is close to that of Si ($\alpha = 4 \times 10^{-6}/°C$.) and superior water absorption characteristics. Namely, the coefficient of water absorption after a pressure cooker test (PCT) for an elapsed time of 150 hours is about 1/30 of that of glass epoxy substrate. Therefore, the above list represents especially desirable ranges of composition.

The conventional $Al_2O_3$ substrate contains 92 to 93% of $Al_2O_3$. Its firing temperature is on the order of 1500° to 1600° C., and possesses $\epsilon$ s of 10.5 to 12, tan $\delta$ of (2 to 5)$\times 10^{-3}$, $\rho$ of (0.2 to 5)$\times 10^{13}$ $\Omega$.cm and $\alpha$ of about $8 \times 10^{-6}/°$ C. In contrast, according to the present invention it is possible to obtain a substrate that possesses characteristics that are comparable to or even superior to those of $Al_2O_3$, at a firing temperature which is substantially lower than the temperature for $Al_2O_3$.

An example of forming a multilayered wiring substrate by means of simultaneous sintering by the use of a black insulating substrate obtained by the present invention will now be described.

First, slurry that contains powdered raw materials in the desired composition ratios of BaO, $SnO_2$, $B_2O_3$, $TiO_2$, $SiO_2$, and MnO is prepared. This slurry is prepared by adding to the powdered raw materials a binding agent such as polyvinyl butyral or acryl resin, a plasticizer such as dioctyle phthalate or polyethylene glycol, a peptizer such as menhaden oil, and a solvent such as etyl alcohol, trichloroethylene, ethyl methyl ketone or n-butanol. Using this slurry a green sheet is prepared using the doctor blade method. Next, using a conducting paste such as a silver-based paste a first conducting layer is applied by printing, followed by drying. Then, an insulating paste containing the powdered raw materials in the desired component ratio of BaO, $SnO_2$, $B_2O_3$, $TiO_2$, $SiO_2$, and MnO is applied to the first conducting layer by printing. After drying, a second conducting layer is formed in the same way. The insulating paste is applied to the first conducting layer after it is prepared into paste form by adding butyl carbitol acetate, terpineol, ethyl cellulose, and the like.

A green sheet provided with wiring of more than two layers is fired simultaneously in an electric oven, for example, at about 1000° C. for three hours, to produce a multilayered wiring substrate.

A black circuit substrate obtainable by the present invention is especially excellent for use as a substrate with multilayered wiring for simultaneous firing. According to the present invention, insulating layer that can be fired at low temperatures can be provided, so that it becomes possible to use as the conducting layer such a paste as that based on Ag, Cu, Au, or Ni that has small sheet resistance, in place of W, Mo, or others that has been used in the conventional technology. In particular, since the substrate does not contain glass component, its structure is dense with creation of only small number of vacant holes, problem such as migration will not arise even when use is made of an Ag-based paste. Accordingly, it is possible to enhance the wiring density and improve the density of the device. Moreover, the amount of Pd, for example, in an Ag-based paste can be reduced so that it becomes possible to provide a substrate which is superior from the viewpoint of manufacturing costs.

When use is made in the conventional technology of a conducting paste such as W or Mo for $Al_2O_3$, it used to be necessary to perform simultaneous sintering in a reducing atmosphere. However, the present invention permits the use of Ag or Au so that firing in the ordinary air becomes possible, which leads to realization of such effects as facilitation in production and reduction in manufacturing costs. Further, there is no glass component included in the substrate so that migration of Ag will not take place easily.

It should be mentioned that, although description for this example was made in conjunction with the case of printed multilayers, the method will be applicable also to the case of the so-called green sheet maltilayers.

Moreover, in the case of printed multilayers, use as the base may be made not only of the circuit substrate obtained by the present invention but also of other bases such as $Al_2O_3$ substrate or mullite substrate.

As described in the foregoing, according to the present invention, it is possible to obtain a black circuit substrate with the property of opacity to or absorption of light that can be fired at a low temperature of below about 1300° C., in particular, of order of 800° to 1200° C.

Therefore, the substrate obtained by the present invention is effective for high density wiring, especially for multilayered black substrate due to cofiring technology. Moreover, the coefficient of thermal expansion of the substrate can be made small so that it is effective also as a substrate for high density hybrid IC on which is mounted directly an LSI chip or the like.

EXAMPLES OF THE INVENTION

In what follows there will be given description about embodiments of the present invention. A black circuit substrate according to the present invention is manufactured as follows.

First, the powdered raw materials of BaO, $B_2O_3$, $SnO_2$, $TiO_2$, $SiO_2$, and MnO were blended in desired component ratios. The blended powder was then placed together with alumina balls in a pot made of alumina, and was subjected to wet grinding in a vibration mill for about 16 hours. These powdered raw materials may be used in the form which will be converted to oxides upon sintering, for instance, in the form of carbonates. In the present embodiments, use was made of $BaCO_3$, $H_3BO_3$, $SnO_2$, $TiO_2$, $SiO_2$, and $MnCO_3$. Then, following a dehydration and drying, it was subjected to calcination by heating at a temperature of 700° C. to 1200° C. for about three hours. The material was placed once again in the alumina pot, and was dried after wet grinding of about 30 hours.

Next, a binder such as polyvinyl alcohol (PVA) was added, and the material was granulated.

Following that, the granulated powders were filled into a mold, molded under a pressure of about 1000 kg/cm$^2$, and fired in the air for about three hours at a temperature of 800° to 1300° C. to obtain samples.

Disk-shaped samples of 22 mm diameter and 1 mm thickness and rectangular plate-shaped samples of 20$\times$10$\times$2 mm were prepared, and their characteristics were measured. The results are shown in Table. 1. Here, measurements of specific dielectric constant ($\epsilon$s), dielectric loss (tan $\delta$), and resistivity ($\rho$) were made in the following manner. Namely, Ag paste was printed in a concentric circular pattern on both sides of the disk-shaped sample by 325 mesh screen printing. After drying, the sample was given a baking treatment of heating in the air for 20 minutes at 750° C., to form a circular electrode of 20 mm diameter and 15 μm thickness of which measurements were taken. The values in the table for ϵ s and tan δ are those at 1 MHz, and the value for ρ is the lowest value taken one minute after applying 1000 V, under the conditions of the temperature of 25° C. and the relative humidity of 50%.

Further, the coefficient of water absorption is the value obtained by the pressure cooker test (at 121° C. under 2 atm. of evaporated water vapor) as determined from the change in weight before and after the test.

As is clear from Table 1, by the present invention, excellent characteristics such as the firing temperatures that are all below 1300° C. and tan δ that is on the order of $10^{-4}$. Moreover, all samples showed excellent values for flexural strength of above 1300 kg/cm$^2$.

The effect of reduction in the firing temperature of the substrate obtained by this invention is remarkable, and other characteristics of the substrate also show values that are comparable to or better than those of $Al_2O_3$.

In particular, Samples No. 7 and No. 15 possess superior property in that the coefficient of water absorption is very small, being less than 0.5 mg/cm$^2$, even after PCT of 100 hours.

Furthermore, as may be clear from the table the comparative examples (Sample Nos. 16 to 20) have values of $TiO_2$ and $SiO_2$ that deviate from the ranges for the substrates by the present invention, and their water absorption characteristic is larger than and their resistance to water is inferior to those of the present invention.

Also, when the amount of MnO deviates from the range for the present invention, there are noticed undesirable effects such as a decrease in the characteristic resistivity and an increase in tan δ.

Next, examples of forming multilayered wiring substrate by sinultaneous simtering using insulating substrate obtained in accordance with the present invention will be described.

First, slurry that contains powdered raw materials in the desired composition ratios of BaO, $SnO_2$, $B_2O_3$, $TiO_2$, $SiO_2$, and MnO is prepared. This alurry is prepared by adding to the powdered raw materials a binding agent such as polyvinyl butyral or acryl resin, a plasticizer such as dioctyle phthalate or polyethylene glycol, a peptizer such as menhaden oil, and a solvent such as etyl alcohol, trichloroethylene, ethyl methyl ketone or n-butanol. Using this slurry a green sheet is prepared using the doctor blade method. Next, using a conducting paste such as a silver-based paste a first conducting layer is applied by printing, followed by drying. Then, an insulating paste containing the powdered raw materials in the desired component ratio of BaO, $SnO_2$, $B_2O_3$, $TiO_2$, $SiO_2$, and MnO is applied to the first conducting layer by printing. After drying, a second conducting layer is formed in the same way. The insulating paste is applied to the first conducting layer after it is prepared into paste form by adding butyl carbitol acetate, terpinoel, ethyl cellulose, and the like.

A green sheet provided with more than two layers of wiring is sintered simultaneously in an electric oven, for example, at about 1000° C. for three hours, to produce a nultilayered wiring substrate.

In Table 2 are shown various characteristics of the multilayered wiring substrate obtained in the above manner. In the table, the adhesion strength value indicates the degree of adhesion between the substrate and the conducting layer measured by bonding a wire for tension test by soldering it to the topmost conducting layer and using an Instron tensile tester (at a pulling speed of 0.5 cm/min). Further, the wire bonding characteristic shows the adhesion strength between the conducting layer and the Au- or Al- based 25 μm diameter bonding wire. The sample number in the table indicates that the ceramic raw material powder of the composition ratio with the same number as in Table 1 is utilized. Further, each characteristic listed in the table represents the mean value of 10 samples of the same kind.

In addition, the various characteristics of the conducting pastes that appear in Table 2 are listed in Table 3.

The adhesion strength and bonding characteristics are all above 1 kg/mm$^2$ and above 5 g, respectively, which give no problem in practical use, and all examples satisfy these requirements quite adequately. The sheet resistances also are able to attain the set values of the conducting pastes.

The firing temperature required during simultaneous firing varies depending upon the composition of the samples, but the range of 800° to 1200° C. is preferred. This is because if the firing temperature is too high, $B_2O_3$ becomes easy to evaporate, so that it is difficult to obtain a uniform substrate. Further, if the temperature is above 1200° C., Au and Ag are diffused throughout the ceramic so that it becomes difficult to obtain a satisfactory sheet resistance.

In the conventional technology, it was necessary to perform simultaneous sintering in a reducing atmosphere when a conducting paste such as W or Mo is used for $Al_2O_3$. However, according to the present invention, use of Ag or Au, and hence the firing in air, becomes possible so that it is possible to attain such effects as easy manufacture and cost reduction.

Moreover, since there is no glass component included in the substrate, migration of Ag can be suppressed.

Furthermore, in the present invention, description was made in conjunction with the case of printed multilayers. However, similar effects can also be expected in the case of green sheet multilayers.

TABLE 1

| | Sample No. | Composition Ratio (mol %) | | | | | | Firing Temp. (°C.) | Values of Characteristics | | | Color | Coefficient of Water Absorption (after 50 hours) (mg/cm$^2$) |
|---|---|---|---|---|---|---|---|---|---|---|---|---|---|
| | | BaO | $SnO_2$ | $B_2O_3$ | $TiO_2$ | $SiO_2$ | MnO | | ($\times 10^{13}$) Ω·cm | ϵs (1MHz) | tan δ (1MHZ $\times 10^{-3}$) | | |
| Embodiments | 1 | 30.15 | 27.67 | 27.35 | 2.45 | 8.17 | 4.21 | 950 | 30 | 8.50 | 2 | BLACK | 0 |
| | 2 | 35.51 | 12.56 | 16.74 | 12.56 | 6.10 | 3.5 | 980 | 9.5 | 9.40 | 5 | " | " |
| | 3 | 29.49 | 26.54 | 29.49 | 2.95 | 9.82 | 1.71 | 1,000 | 320 | 8.25 | 0.6 | DARKBROWN | " |
| | 4 | 31.70 | 21.97 | 27.77 | 9.56 | 7.5 | 1.5 | 900 | 15 | 8.70 | 4.0 | " | " |
| | 5 | 25.60 | 7.9 | 11.50 | 25.0 | 25.0 | 5.0 | 820 | 10.5 | 9.70 | 4.0 | BLACK | " |

TABLE 1-continued

| Sample No. | Composition Ratio (mol %) | | | | | | Firing Temp. (°C.) | Values of Characteristics | | | Color | Coefficient of Water Absorption (after 50 hours) (mg/cm$^2$) |
|---|---|---|---|---|---|---|---|---|---|---|---|---|
| | BaO | SnO$_2$ | B$_2$O$_3$ | TiO$_2$ | SiO$_2$ | MnO | | ($\times 10^{13}$) $\Omega \cdot$ cm | $\epsilon_s$ (1MHz) | tan $\delta$ (1MHZ $\times$ 10$^{-3}$) | | |
| 6 | 20.75 | 28.90 | 25.65 | 5.0 | 15.2 | 4.5 | 900 | 7.5 | 9.5 | 6.0 | " | " |
| 7 | 30.70 | 27.63 | 30.69 | 3.07 | 6.13 | 1.78 | 980 | 140 | 8.30 | 0.9 | DARKBROWN | " |
| 8 | 21.01 | 18.30 | 37.59 | 11.6 | 5.0 | 6.5 | 850 | 0.5 | 10.5 | 8.0 | BLACK | " |
| 9 | 51.41 | 6.03 | 12.70 | 19.86 | 4.5 | 5.5 | 1,100 | 4.0 | 8.50 | 5.5 | " | " |
| 10 | 21.30 | 35.5 | 30.20 | 7.5 | 3.0 | 2.5 | 970 | 35 | 8.30 | 1.5 | " | " |
| 11 | 31.20 | 28.07 | 31.19 | 3.12 | 6.23 | 0.19 | 1,050 | 150 | 8.20 | 0.7 | BROWN | " |
| 12 | 52.73 | 24.11 | 10.71 | 8.95 | 2.5 | 1.0 | 1,250 | 5.5 | 9.0 | 0.5 | DARKBROWN | " |
| 13 | 29.64 | 26.68 | 29.64 | 2.96 | 5.92 | 5.16 | 950 | 3.9 | 8.30 | 5 | BLACK | " |
| 14 | 25.2 | 17.8 | 39.50 | 7.5 | 6.50 | 3.50 | 800 | 50 | 8.05 | 2 | " | " |
| 15 | 30.10 | 27.25 | 30.15 | 3.00 | 6.00 | 3.50 | 1,000 | 100 | 8.40 | 2 | " | " |
| Comparative Example 16 | 31.25 | 28.13 | 31.25 | 3.12 | 6.25 | 0 | 1,050 | 90 | 8.20 | 0.5 | WHITE | " |
| 17 | 20.83 | 18.50 | 37.5 | 9.40 | 3.35 | 10.42 | 800 | 3.5 $\times$ 10$^{-8}$ | 11.80 | 250 | BLACK | " |
| 18 | 27.2 | 11.8 | 42.50 | 7.50 | 6.50 | 3.50 | 800 | 55 | 7.8 | 3 | " | 0.15 |
| 19 | 25.5 | 43.85 | 4.5 | 14.8 | 10.15 | 1.20 | 1,300 | 5 $\times$ 10$^{-3}$ | 12.0 | 50 | " | 2.5 |
| 20 | 57.5 | 15.5 | 13.5 | 0.5 | 12.95 | 0.05 | 1,400 | 65 | 7.5 | 0.5 | LIGHTBROWN | 5.5 |

TABLE 2

| Sample No. | Conducting Paste | Simultaneous Firing Temperature (°C.) | Adhesion Strength (kg/mm$^2$) | Bonding Characteristics | | Sheet Resistance (m$\Omega$/□) | Conductor Thickness ($\mu$m) |
|---|---|---|---|---|---|---|---|
| | | | | Wire | Strength (g) | | |
| 7 | A | 910 | 1.6 | Au | 7 | 5 | 12 |
| 3 | B | 1,000 | 1.4 | A | 9.5 | 25 | 11 |
| 6 | C | 900 | 1.2 | Au | 6.5 | 40 | 14 |
| 5 | D | 820 | 2.0 | Au | 8 | 3 | 13 |
| 13 | E | 950 | 1.5 | A | 6.5 | 20 | 12.5 |
| 10 | F | 970 | 2.5 | Au | 10 | 3 | 16 |
| 15 | G | 930 | 1.2 | A | 11.5 | 4 | 8 |

TABLE 3

| No. | Type of Conducting Paste | Firing Temperature (°C.) | Sheet Resistance (m$\Omega$/□) | Conducting Layer ($\mu$m) |
|---|---|---|---|---|
| A | Ag—Pd | 850–950 | 3–8 | 10–15 |
| B | Ag—Pd | 780–1,000 | 20–30 | 8–13 |
| C | Au—Pt | 900–1,030 | 30–50 | 10–15 |
| D | Ag—Pt | 550–950 | 3–6 | 12.5 |
| E | Ag—Pt | 550–980 | 15–25 | 12.5 |
| F | Au | 850–1,000 | 2–3 | 16–19 |
| G | Au | 850–1,000 | 3–4 | 7–10 |

What is claimed is:

1. A circuit substrate comprising a sintered oxide body used as an insulating body, said sintered oxide body consisting essentially of barium, tin, boron, titanium, silicon, and manganese according to a converted equivalent composition of:

| BaO | 10 to 55 mol %; |
|---|---|
| SnO$_2$ | 2 to 45 mol %; |
| B$_2$O$_3$ | 5 to 40 mol %; |
| TiO$_2$ | 0.1 to 25 mol %; |
| SiO$_2$ | 0.5 to 30 mol %; and |
| MnO | 0.5 to 7 mol %. |

2. The circuit substrate of claim 1, wherein said sintered oxide body consists essentially of barium, tin, boron, titanium, silicon, and manganese according to a converted equivalent composition of:

| BaO | 15 to 40 mol %; |
|---|---|
| SnO$_2$ | 10 to 34 mol %; |
| B$_2$O$_3$ | 20 to 40 mol %; |
| TiO$_2$ | 1 to 15 mol %; |
| SiO$_2$ | 2 to 20 mol %; and |
| MnO | 0.5 to 6 mol %. |

3. The circuit substrate of claim 1, wherein said sintered oxide body consists essentially of barium, tin, boron, titanium, silicon, and manganese according to a converted equivalent composition of:

| BaO | 20 to 35 mol %; |
|---|---|
| SnO$_2$ | 15 to 32 mol %; |
| B$_2$O$_3$ | 20 to 35 mol %; |
| TiO$_2$ | 2 to 10 mol %; |
| SiO$_2$ | 3.5 to 15 mol %; and |
| MnO | 1 to 5 mol %. |

4. The circuit substrate of claim 1, wherein said sintered oxide body consists essentially of barium, tin, boron, titanium, silicon, and manganese according to a converted equivalent composition of:

| BaO | 25 to 35 mol %; |
|---|---|
| SnO$_2$ | 23 to 32 mol %; |
| B$_2$O$_3$ | 20 to 30 mol %; |
| TiO$_2$ | 2 to 7 mol %; |
| SiO$_2$ | 4 to 12 mol %; and |
| MnO | 1 to 3 mol %. |

* * * * *